(12) United States Patent  
Axisa et al.

(10) Patent No.: US 8,207,473 B2  
(45) Date of Patent: Jun. 26, 2012

(54) METHOD FOR MANUFACTURING A STRETCHABLE ELECTRONIC DEVICE

(75) Inventors: Fabrice Axisa, Sacierges-Saint-Martin (FR); Jan Vanfleteren, Gentbrugge (BE); Thomas Vervust, Ghent (BE)

(73) Assignees: IMEC, Leuven (BE); Universiteit Gent, Ghent (BE)

( * ) Notice: Subject to any disclaimer, the term of this patent is extended or adjusted under 35 U.S.C. 154(b) by 1037 days.

(21) Appl. No.: 12/145,369

(22) Filed: Jun. 24, 2008

(65) Prior Publication Data

US 2009/0317639 A1    Dec. 24, 2009

(51) Int. Cl.
 *B23K 26/00* (2006.01)
 *H05K 1/00* (2006.01)
(52) U.S. Cl. .................... 219/121.72; 174/254
(58) Field of Classification Search .. 219/121.6–121.72; 174/69, 254, 256, 258; 29/846–849
See application file for complete search history.

(56) References Cited

U.S. PATENT DOCUMENTS

| | | | | |
|---|---|---|---|---|
| 3,515,619 A | * | 6/1970 | Barnette | 428/15 |
| 5,233,157 A | * | 8/1993 | Schreiber et al. | 219/121.68 |
| 6,344,616 B1 | * | 2/2002 | Yokokawa | 174/117 F |
| 6,743,982 B2 | * | 6/2004 | Biegelsen et al. | 174/69 |
| 7,487,587 B2 | * | 2/2009 | Vanfleteren et al. | 29/846 |
| 7,491,892 B2 | * | 2/2009 | Wagner et al. | 174/254 |
| 7,871,661 B2 | * | 1/2011 | Maghribi et al. | 427/58 |
| 2002/0094701 A1 | | 7/2002 | Biegelsen et al. | |
| 2004/0243204 A1 | | 12/2004 | Maghribi et al. | |

* cited by examiner

*Primary Examiner* — Sang Paik  
(74) *Attorney, Agent, or Firm* — Knobbe Martens Olson & Bear LLP (57) ABSTRACT

A method for manufacturing a stretchable electronic device is disclosed. In one aspect, the device comprises at least one electrically conductive channel connecting at least two components of the device. The method comprises forming the channel by laser-cutting a flexible substrate into a predetermined geometric shape.

22 Claims, 8 Drawing Sheets

METHOD FOR MANUFACTURING A STRETCHABLE ELECTRONIC DEVICE

BACKGROUND OF THE INVENTION

1. Field of the Invention

The present invention relates to a method for manufacturing a stretchable electronic device.

2. Description of the Related Technology

Building electronic circuits on flexible substrates such as plastic has many advantages. The entire system can be made thinner and more lightweight compared to rigid electronics. Due to its flexibility it can also be folded in irregular forms. Flexible circuits are often used in applications where flexibility, space savings, or production constraints limit the use of rigid circuit boards. Flexible circuits can lead up to a large number of new applications such as flexible displays used in foldable reading systems or flexible circuits embedded in textile.

In some applications there is a need for stretchable interconnections for electrically connecting electronic devices and allowing relative movement of the electronic devices with respect to each other. Several methods are known in the state of the art for obtaining such a stretchable electronic device.

US-A-2002/0094701 relates to a stretchable interconnect for electrically connecting electronic devices which are movable relative to one another and a method for making such a stretchable interconnect. In a first process step electronic devices are formed on a substrate, the devices being spaced from each other. Next, a layer of elastic and conductive material, from which the stretchable interconnects will be formed, is deposited uniformly over the substrate. After the metal layer is deposited, it is photolithographically patterned with a pattern which upon removal of the substrate from support of the interconnect conductor will cause the interconnect conductor to form a stretchable interconnect. Preferably, the conductive material has a stress gradient extending through at least a portion of the thickness of the conductor. Preferably, the patterned interconnect is V-shaped.

US-A-2004/0243204 relates to a stretchable electronic device and a method of fabricating stretchable, polymer-based electrically conducting traces. In a first process step, photolithography is used to define at least one microchannel to produce the casting mould. The substrate on which the microchannel is formed is a stretchable polymer body. In a next process step, the at least one microchannel is filled with a conductive media such as conductive ink, such that at least one circuit line is created. The circuit line has a longitudinal component that extends in the longitudinal direction of the device and an offset component that is at an angle to the longitudinal direction. The longitudinal and offset component allow the apparatus to stretch in the longitudinal direction while maintaining the integrity of the circuit line.

Both US-A-2002/0094701 and US-A-2004/0243204 make use of the photolithographic process for creating the stretchable conductive channels. The photolithographic process comprises a number of different process steps. At first a photosensitive material is deposited on the top surface of a substrate. The photosensitive layer is then exposed to light using an appropriate mask. The mask ensures that areas of the photosensitive material are appropriately exposed to the light such that a two-dimensional pattern corresponding to the stretchable interconnects is formed. Next, the appropriate areas are etched away in a number of different etching process steps. The used photosensitive material and etching chemicals depend on the type of substrate for which is it used. The mask defines the form of the formed stretchable interconnects. As a result, the process for creating the stretchable conductive channels differs for different kinds of substrates. Another disadvantage is that for every change of the form of the channel, another mask is needed.

SUMMARY OF CERTAIN INVENTIVE ASPECTS

Certain inventive aspects relate to an alternative method for manufacturing a stretchable electronic circuit, which is faster and easier to adjust to a change in the type of substrate or a different shape of the channels.

In an aspect, a method for manufacturing a stretchable electronic device is disclosed. The device comprises at least one electrically conductive channel connecting two components of the device. The channel has a predetermined geometric shape thereby realizing a stretchable channel. The method comprises providing a flexible substrate. The flexible substrate comprises an insulating material and at least one electrically conductive material. The flexible substrate is formed into the geometric shape by laser-cutting, such that a stretchable electronic device is realized.

In an aspect, a method of manufacturing a stretchable electronic device is disclosed. The device comprises at least one electrically conductive channel connecting at least two electrical components, the channel having a predetermined geometric shape by which the channel is stretchable. The method comprises providing a flexible substrate comprising at least one layer of electrically conductive material on or included in an insulating material, and cutting a predetermined geometric shape from the flexible substrate by laser, thereby creating at least one stretchable conductive channel.

DETAILED DESCRIPTION OF CERTAIN ILLUSTRATIVE EMBODIMENTS

Certain embodiments are more widely applicable because they can be used for creating stretchable electrically conductive channels on or in any type of flexible substrate, as long as the flexible substrate is laser patternable.

Certain embodiments allow transforming a flexible board including electrical connections and circuitry into a stretchable board and circuitry with similar complexity. Furthermore, they allow connecting flexible and stretchable parts of electronic circuitry in a reliable way. Also stretchable electrical connections between flexible parts of circuitry can be made in a reliable way.

Another advantage compared to the process of photolithography is that it is easier to adjust. The process for creating the stretchable conduits does not need to be changed when another flexible substrate is used. In the photolithographic process the type of etching chemicals and/or the type of photosensitive material needs to be changed when switching from one substrate to another. The process for creating the stretchable conduits does not need to be changed when a different geometric shape of the channels is needed or a different size of the channels is required. In the photolithographic process every change in the shape or size of the channels requires a different mask.

Another advantage of the process according to an embodiment is that it is a much faster method as compared to the photolithographic process. Where the photolithographic process requires different process steps, such as the application of a photosensitive layer, the creation of a mask and different etching processes, the method according to an embodiment creates the conductive channel in one single process step, by simply laser cutting the flexible substrate with the layer of electrically conductive material together. This makes the process very suitable for fast prototyping a stretchable system.

Another advantage of the process according to one embodiment with respect to the photolithographic process is that multi-layer connections can be made, as the laser is able to cut through multiple layers at the same time. This allows increasing the number of electrically conductive channels per square area. Also the creation of micro-channels out of electrically conductive channels both in monolayers and multi-layer structures allows to further increase the number of electrically conductive channels per square area Moreover, laser cutting is an easier process. As a result the risk to mistakes is smaller, which makes the process simpler and more reliable as compared to the photolithographic process.

The width of the channels is only limited by the resolution of the laser used for laser patterning. It is therefore possible to divide the at least one electrically conductive channel in two or more coplanar micro-channels, by laser-cutting through the geometric shape. Using this type of micro-channels, it is for instance possible to obtain a stretchable RF wave guide. Three parallel micro-channels are hereby created, where the two boundary channels are ground connected and the inner channel is a signal conducting track. Also three layers of conductive material on top of each other and separated by an electrically insulating layer can be used to realize different channels. In general it is possible to connect the different micro-channels and/or stacked channels to different electronic components on the substrate. In this way the micro-channels and/or stacked channels are able to create an interconnection between a number of different electronic components on the substrate on a very small area of the substrate.

Figure 1A:
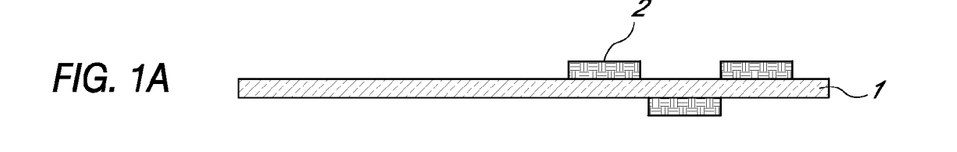
FIGS. 1A to 1H show cross sections of the stretchable electronic device in different process steps of one embodiment of the method
Figure 2A:
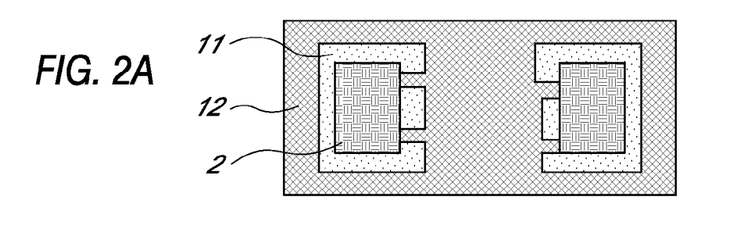
FIGS. 2A to 2H show top view image of the stretchable electronic device in different process steps of one embodiment of the method.

FIG. 1A shows the starting point for certain embodiments. The starting point to create a stretchable electronic circuit is a flexible substrate 1 on which electronic components 2 can be attached or not. The components can be soldered or attached to the substrate with any method known in the art. They can be also attached or soldered at another point stage of the process (for example between the process steps represented in FIGS. 2E and 2F). The flexible substrate 1 can be a monolayer or a multilayer substrate. The flexible substrate can be made of an insulating flexible material 11, for example polyimide, polyester, polyethylene (PEN), polyethersulphones (PES) or a combination thereof. Conductors 12, such as Cu, Al, or other conducting materials used in the field can be applied on or included in the insulating material, thereby realizing multi-layer structures such as polyimide/Cu or a stack of for example Cu/polyimide/Cu/ . . . . The conducting materials can be patterned into a geometrical structure, or not. Patterning can be used to realize connections or macro-channels to different contacts on the electrical components 2 (see FIGS. 2A and 2B). The whole stack is flexible. The flexible substrate 1 is laser patternable. FIGS. 1A and 2A respectively show a cross section and a top view of a flexible substrate 1 on which electronic components 2 have been attached. The flexible substrate 1 shown in FIGS. 1A and 2A can be a monolayer or multilayer flexible substrate which is laser patternable.

Figure 1B:
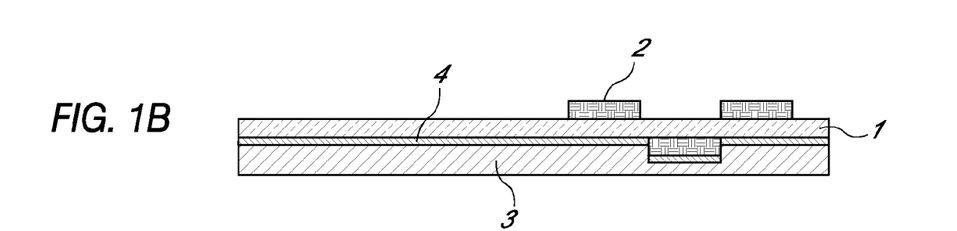
Figure 2B:
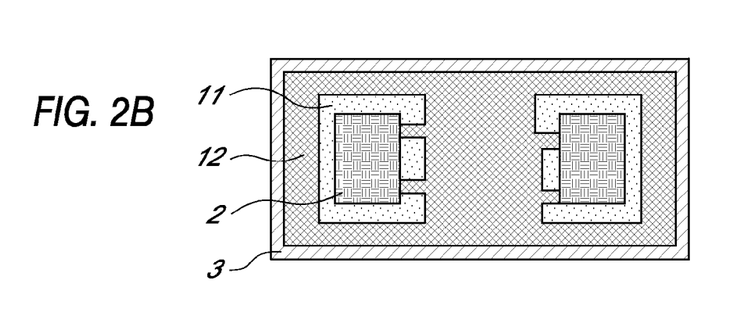

Preferably, the flexible substrate 1 is attached to a supporting layer 3 (FIGS. 1B and 2B) in order to limit movement and/or mechanical strain of the flexible substrate 1 during further processing and to improve the flatness of the flexible substrate 1 during processing. The attachment can be done by any process considered suitable by the person skilled in the art. The attachment can for instance be done by using an adhesive 4, such as wax or tape. The attachment can also be done by using cooperating positioning systems with a complementary shape, for instance by providing the flexible substrate with an elongated projection which cooperates with an elongated groove on the supporting layer. The supporting layer 3 can be made of any material considered suitable by the person skilled in the art, such as a ceramic material, metal or polymer. It may be advantageous to use aluminum as a supporting layer as this has the advantage to withstand high temperatures that may be generated during laser-cutting. The flexible substrate 1 may be attached to a supporting layer 3 along part of its surface or along its whole surface. The supporting layer 3 can be laser patternable, but preferably is not laser patternable. FIGS. 1B and 2B respectively show a cross section and a top view of the flexible substrate 1 which is attached to a supporting layer 3 by using an adhesive 4.

Figure 1C:
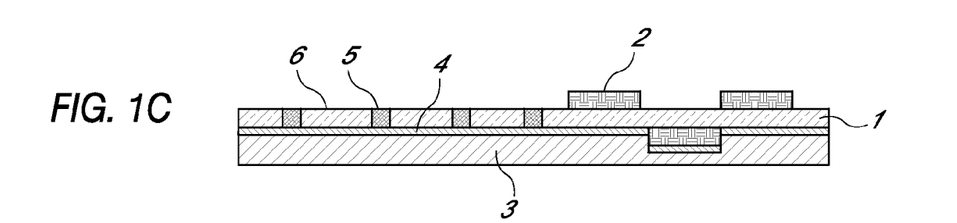

An electrically conductive material can be applied on top or included in the layer of insulating material. Thereto, a layer of an electrically conductive material 12 can be applied on a layer of insulating material 11. This can be done by any technique considered suitable by the person skilled in the art, such as for instance lamination, electron-beam deposition, chemical vapor deposition, sputter deposition, . . . . The layer of electrically conductive material 12 can be applied on the insulating material 11 before or after connection of the flexible substrate 1 to the supporting layer 3. The layer of electrically conductive material can cover only part of the flexible substrate 1 or the whole flexible substrate 1. The layer can be applied on one side of the insulating material or on both sides. The layer of conductive material can be patterned into a geometrical shape or not. Near the electronic components 2 the conducting material 12 may only be present at certain locations, i.e. at the electrical connections to the electronic components (see for example FIGS. 2A and 2B). In between the electrical connections, there may be no conducting material such as to electrically isolate the different connections. Patterning the conducting material into a geometrical shape can be done by any method known in the art, such as evaporation through a mask, lithography and lift-off, lithography followed. The layer of conductive material can be covered with another layer of flexible material or not. These process steps can be repeated, thereby realizing a multilayer of insulating and conducting layers. The complete stack of insulating materials and conducting layers is flexible and is represented by the flexible substrate 1 in FIGS. 1 and 2. In FIGS. 1A to 1H and 2A to 2H it is assumed that the layer of electrically conductive material is previously applied to or included in the insulating material resulting in the flexible substrate 1. Then, a geometric shape is cut from the flexible substrate comprising at least one layer of electrically conductive material with a laser (FIGS. 1C and 2C). After laser cutting the flexible substrate, the laser treated part can be divided in at least one electrically conductive channel 5 connecting for example two electronic components of the electronic device, and an unused cut part, which is hereinafter called the residual part 6, as shown in FIGS. 1C and 2C.

Figure 6A:
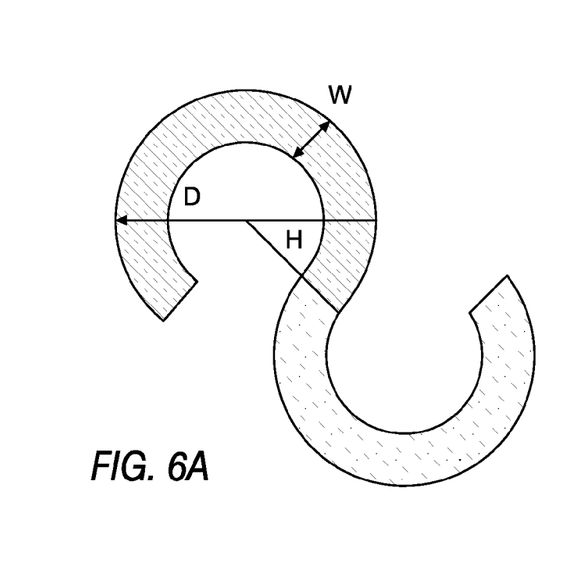
FIGS. 6A to 6D show certain embodiments of the geometric shape of the conductive channel.
Figure 6B:
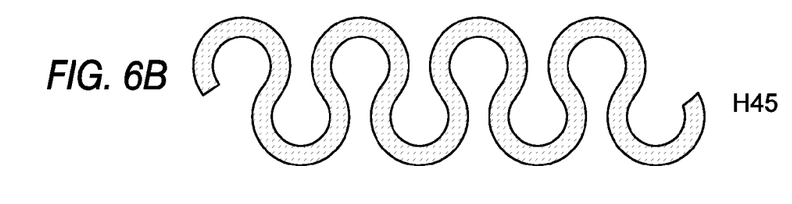
Figure 6C:
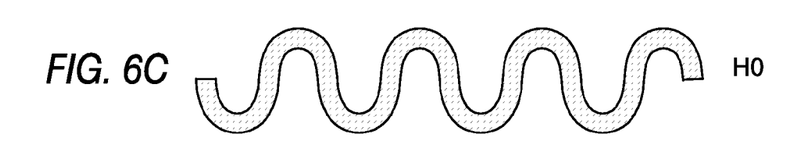
Figure 6D:
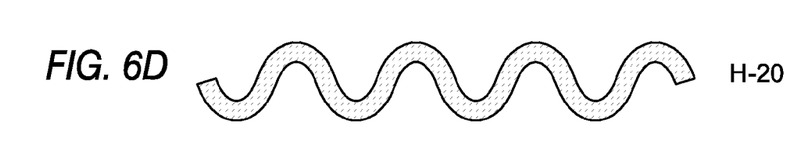

The at least one electrically conductive channel 5 has a geometric shape by which the channel is stretchable. The geometric shape can be any shape considered suitable by the person skilled in the art. In an embodiment, the geometric shape is meander shaped, as is shown in FIG. 2C. The meanders may have a horseshoe shape, as shown in FIGS. 6A to 6D. Horseshoe shapes are circular segments and are defined by an angle H with respect to a 0°-baseline, a width W and a diameter D, as shown in FIG. 6A. These three features define the properties of the horseshoe shaped conductive channels. The horseshoe may be designed such that the elongation of the horseshoe channel is maximized and the electrical resistance of the horseshoe channel is minimized. The angle can vary between about −30° and 60° or between about −20° and 45°, or between about −10° and 25°. FIGS. 6B to 6D show three embodiments of the horseshoe shape. FIG. 6B shows a H45 configuration, i.e. a horseshoe shape in which the angle H makes an angle of about 45° with respect to the 0°-baseline. The H45 configuration has a high maximum elongation, but has a relatively high electrical resistance. FIG. 6D shows a H-20 configuration, i.e. a horseshoe shape in which the angle H makes an angle of about −20° with respect to the 0°-baseline. The H-20 configuration is a stackable structure to reduce drastically the pitch. FIG. 6C shows a H0 configuration, i.e. a horseshoe shape in which the angle H makes an angle of 0° with respect to the 0°-baseline. The H0 configuration has a lower maximum elongation, but has a lower electrical resistance.

Figure 5A:
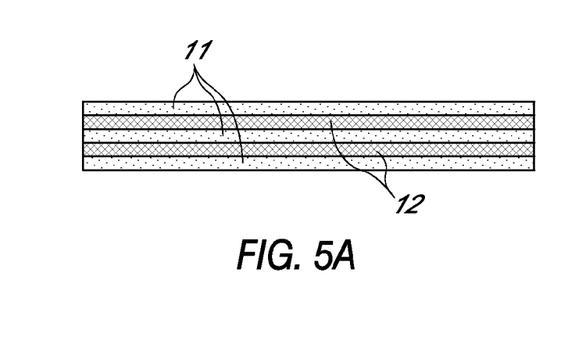
FIG. 5 shows a multilayer stretchable electronic device.
Figure 5B:
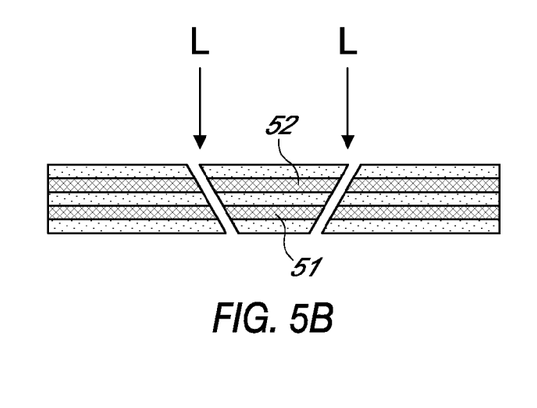

Laser cutting can be done perpendicular to the flexible substrate or the support, i.e. at an angle of 90° with respect to the flexible substrate or the support or the laser cut L can have a certain angle different from 90° with respect to the flexible substrate or the support (see FIG. 5B), for example between about 30° and 60° or between about 40° and 50°.

The used laser should be powerful enough to ensure a perfect cut of the at least one flexible substrate 1 and the at least one layer of electrically conductive material. Any kind of laser considered suitable by the person skilled in the art can be used. Use may be made of a laser with an optimal optical resolution, since the maximum resolution of the laser defines the minimum width of the created channels. A Nd—YAG laser can for instance be used, with an ablation speed of about 5 mm/s, a frequency of about 10 kHZ and a Gaussian beam spot of about ±20 μm diameter.

Figure 1D:
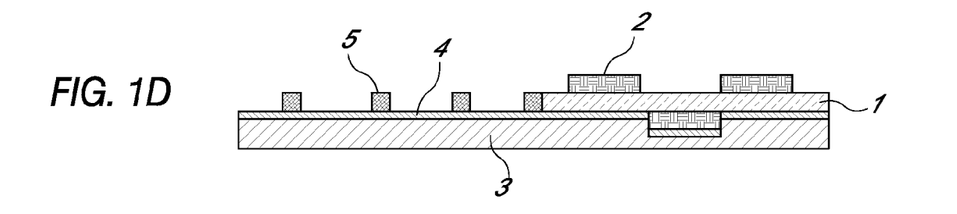
Figure 1E:
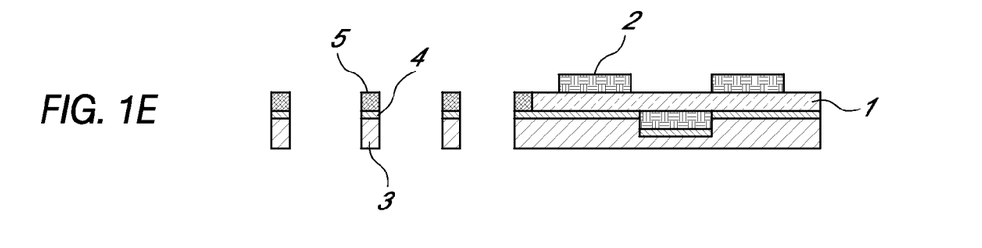
Figure 1F:
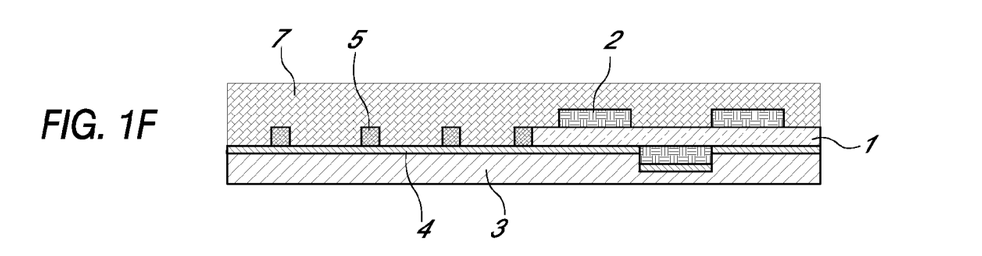
Figure 2C:
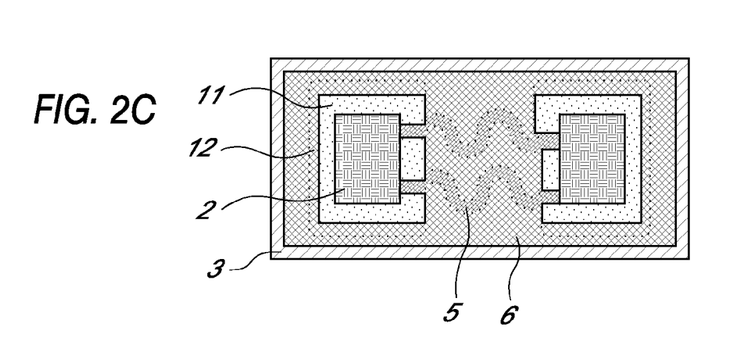
Figure 2D:
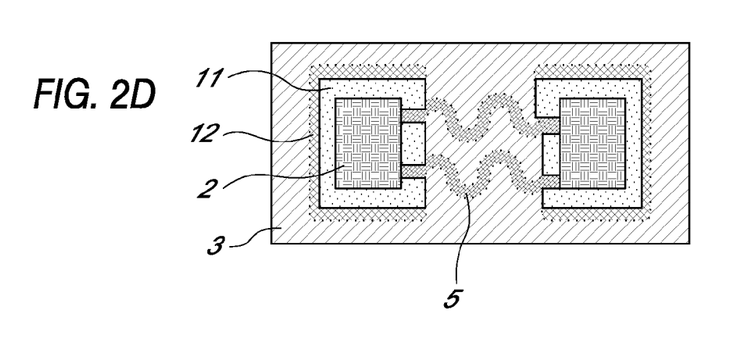
Figure 2E:
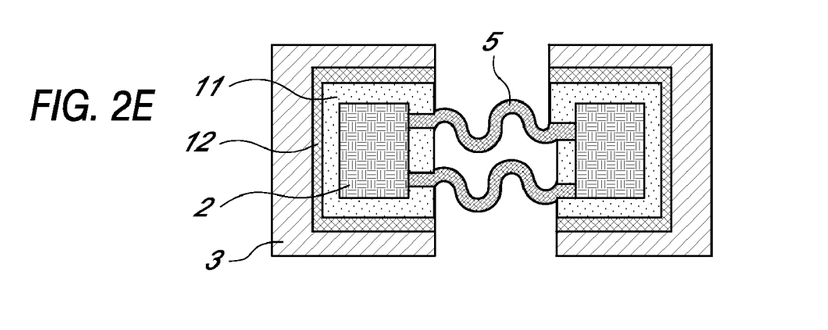

Preferably, in a next process step, after the flexible substrate 1 and the layer of electrically conductive material have been laser patterned, the residual cut part 6 can be removed from the flexible substrate 1 (FIGS. 1D and 2D). This can be done by any method considered suitable by the person skilled in the art. A first solution is for instance to mechanically remove the residual part 6 (FIGS. 1D and 2D). A second solution is to cut the residual part 6 with the laser in a number of small pieces. A third solution is to laser cut the flexible substrate 1 and the layer of electrically conductive material together with the supporting layer 3, such that the residual part 6 can be pushed off after cutting (FIGS. 1E and 2E). The result of the first and second solution is shown in FIGS. 1D and 2D; the result of the third solution is shown in FIGS. 1E and 2E. After removing the residual part, at least one electrically conductive channel 5 remains, the at least one channel connecting two electronic components of the electronic device. At the end of this stage, additional electronic components can be soldered on the flexible substrate if needed. At the end of this stage, if the flexible substrate 1 is rigid enough, it is possible to remove the flexible substrate 1 from the supporting layer 3. This process step can also be performed in a later stage, for instance after embedding the conducting channels in a polymer (see FIGS. 1F and 2F).

Figure 2F:
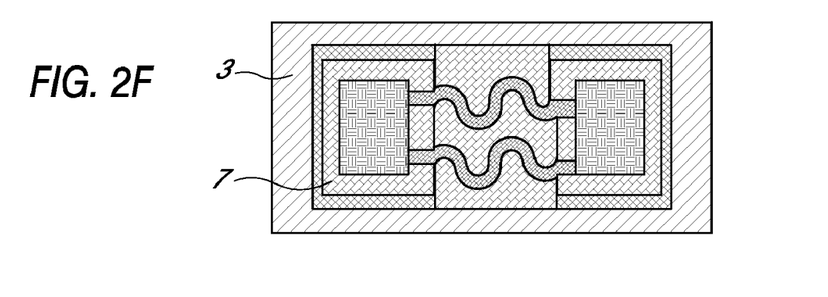

Preferably in a next process step a first layer of embedding polymer 7 (for example silicone) is applied on top of the electronic device at the side of the conducting channels as is shown in FIGS. 1F and 2F. This can be done by any method considered suitable by the person skilled in the art, such as moulding, casting or laminating. If desired, any kind of adhesion promotion treatment can be applied before embedding the flexible substrate in the polymer layer, such as plasma treatment, adhesion promoter layer, . . . . The adhesion promoter and/or plasma treatment enhance the adhesion between the flexible substrate 1 and first embedding layer 7. To improve the adhesion of the polymer layer to the flexible substrate, extra holes can be made in the flexible substrate on some location. The size of the holes can vary, for example between about 50 μm and 1000 μm or between about 100 μm and 500 μm or between about 150 μm and 300 μm. The distance between the holes may be in the same order as the size of the holes or can be larger.

Figure 1G:
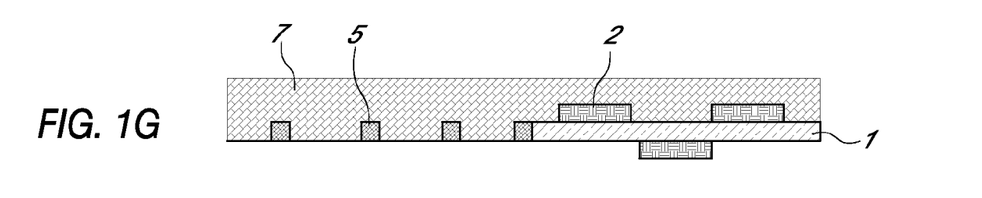
Figure 2G:
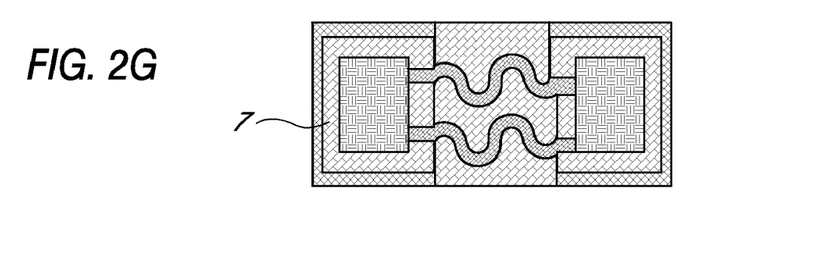

Preferably, in a next process step, when the supporting layer 3 is not yet removed, the supporting layer 3 is removed as is shown in FIGS. 1G and 2G. Depending on the kind of attachment, the support 3 can be removed by dissolving the adhesive 4, melting the adhesive or remove the tape. If desired, any kind of adhesion promotion treatment can be applied at the side of the support layer, such as plasma treatment, adhesion promoter layer, . . . . Also in this case, the adhesion promoter and/or plasma treatment enhance the adhesion between the flexible second layer 8 and first embedding layer 7.

Figure 1H:
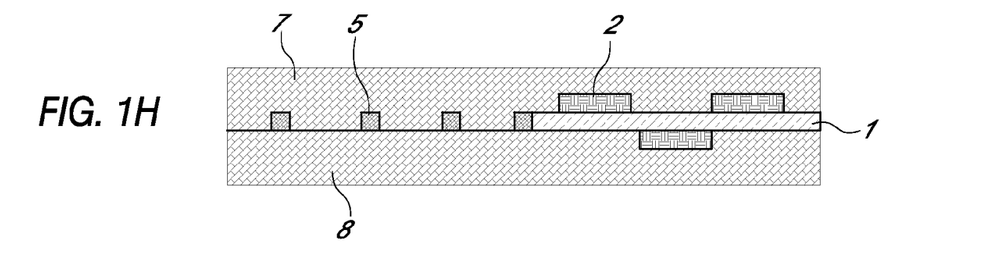
Figure 2H:
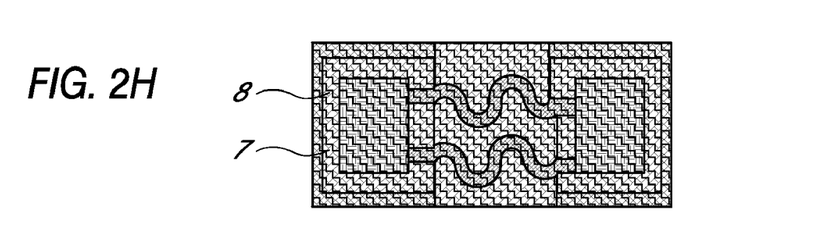

Preferably, in a next process step, a second layer of embedding polymer 8 is applied to the bottom of the electronic device, at the side of the support layer 3, such that the electronic device is completely embedded between the first 7 and the second layer 8 of polymer as is shown in FIGS. 1H and 2H. Also in this case, extra holes in the flexible substrate can increase the adhesion of the polymer layer on the flexible substrate. The polymer of the first and the second embedding layer can be the same, but also different materials can be used. The polymer layers can be (partially) transparent (as is the case in FIG. 2H). The embedding polymer layers can be used for hermetic sealing and mechanical protection of the stretchable electronic device.

The eventual result is a stretchable electronic device comprising at least one electrically conductive stretchable channel that connects at least two electronic components of the device, and all embedded in polymer.

Figure 3:
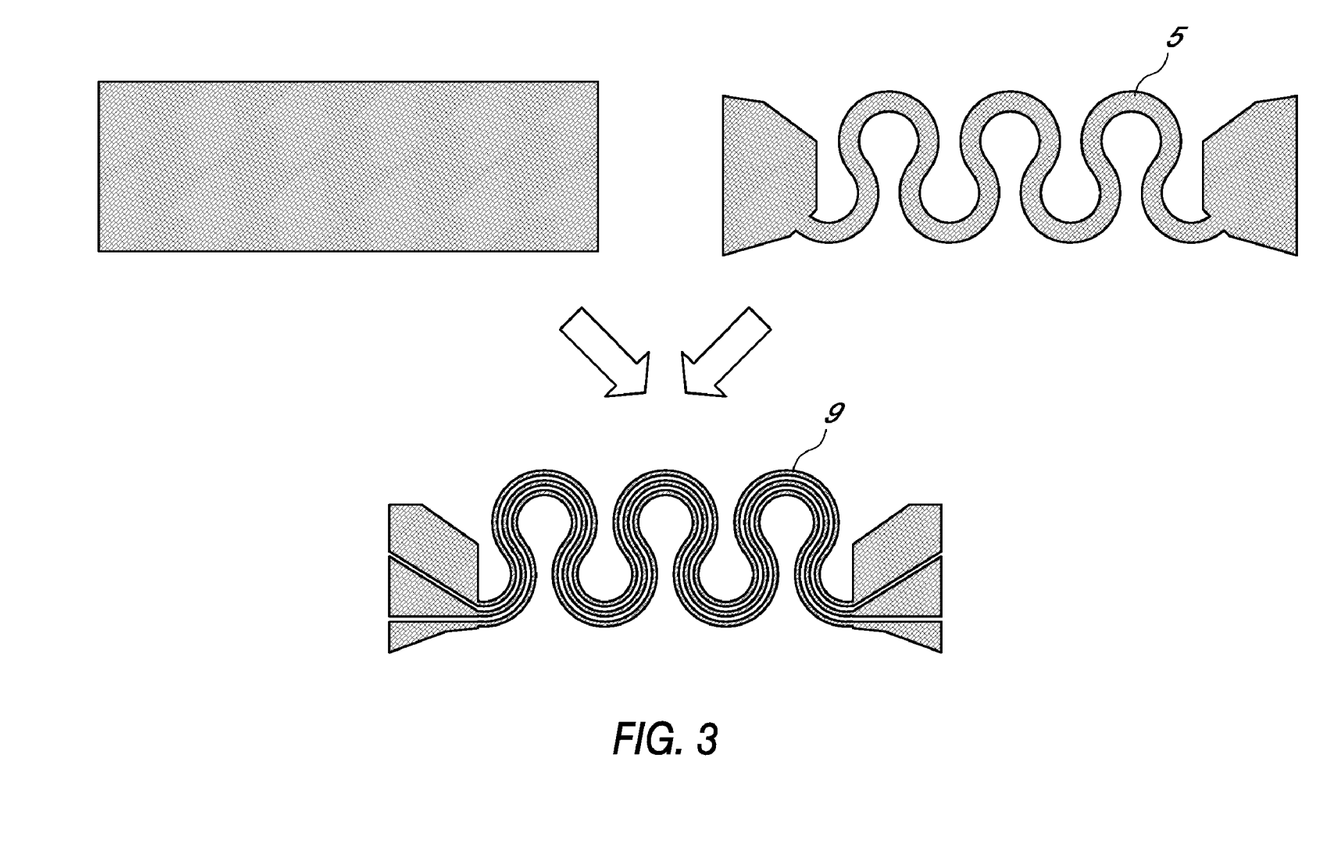
FIG. 3 shows the formation of a triple micro-channel structure.
Figure 4:
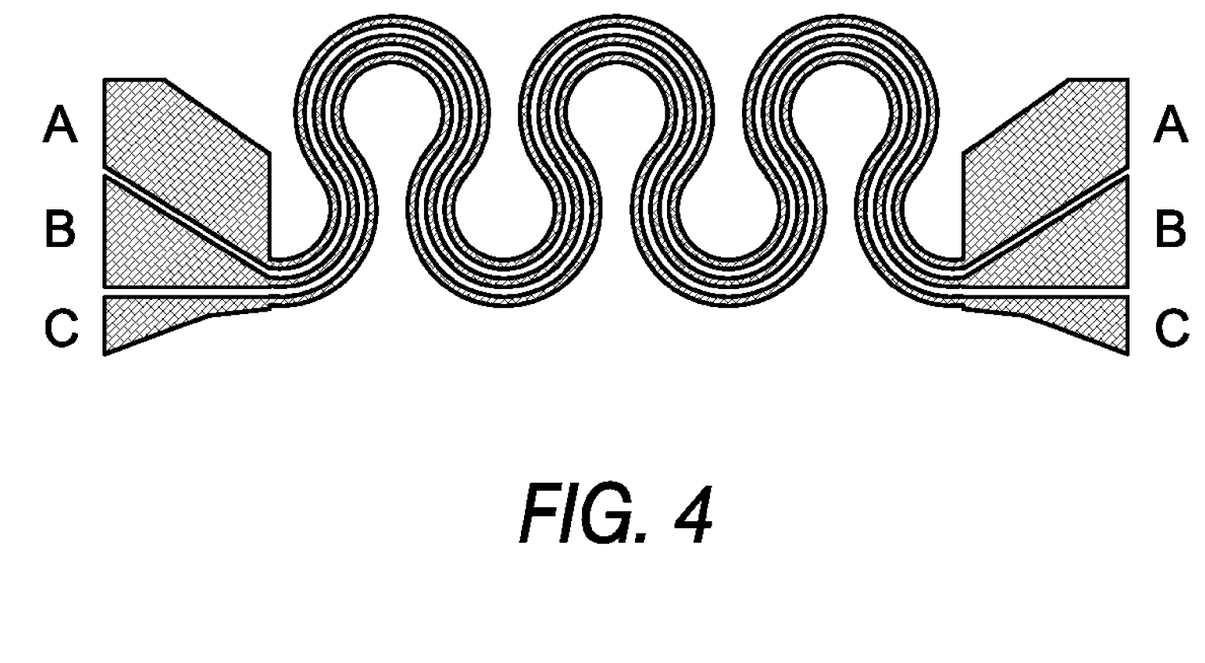
FIG. 4 shows a configuration of a triple micro-channel structure.

Preferably the at least one electrically conductive channel can be further divided in two or more micro-channels 9. This can be done with a second laser or with any other method used in the field. The electrically conductive channel 5 out of which the micro-channels 9 are formed, can be created by any method considered suitable by the person skilled in the art, such as with a photolithographic process or by laser-cutting with a first laser. Preferably, in order to avoid short circuit, the different micro-channels 9 are insulated from each other. This can be done in any way considered suitable by the person skilled in the art. An insulating material can be provided between the different channels or the micro-channels 9 can be embedded in an insulating material, such as an elastomer. The second laser can be the same as or differ from the first laser used to create the electrically conductive channel. Preferably, the second laser has an equal or even better optical resolution as compared to the first laser. Preferably, the laser beam of the second laser has a diameter in the range of 10 μm such that the micro-channels 9 have a width in the range of 10 μm. Different micro-channels 9 can be used to connect different electronic components on the substrate. FIGS. 3 and 4 show a meander shaped electrically conductive channel 5, which is divided in three parallel coplanar micro-channels 9, each of the micro-channels 9 connecting different electronic components A, B, and C. In general, the created micro-channels 9 can have an equal width or not and can connect different electronic components or not. In a configuration of a triple track meander used as an RF wave guide A can be ground, B can be used for the RF signal, and C can be ground.

Figure 5C:
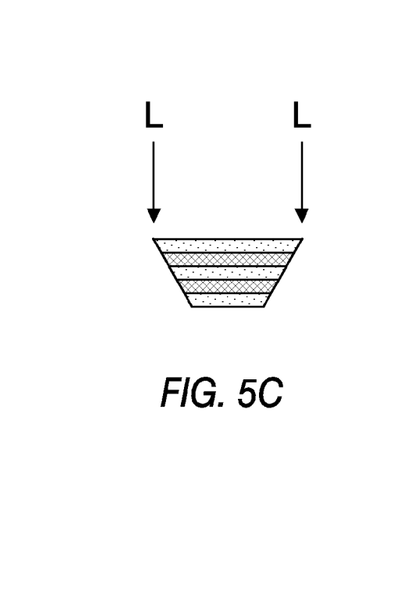

Another advantage of the method according to an embodiment is that it is easy to obtain multilayer stretchable electrically conductive channels. The starting point is a flexible substrate being a multilayer structure (see FIG. 5A), wherein electrically conductive layers 12 are alternating with electrically insulating layers 11. A geometric shape is laser-cut out of the multilayer structure (FIG. 5B) and the material in between the conducting channels can be removed (FIG. 5C). The laser-cut preferably extends from the top to the bottom of the multilayer structure (FIG. 5B), each of the electrically conductive layers thereby forming an electrically conductive channel 5, as is shown in FIG. 5. The electrically conductive channels can be embedded in one or more polymer layers 7.

The multilayer structure shown in FIG. 5 comprises a first insulating layer 11, a first electrically conductive layer 12 applied on top of the substrate, a second electrically insulating layer 11 applied on top of the first electrically conductive layer, a second electrically conductive 12 layer applied on top of the second electrically insulating layer and a third electrically insulating layer 11 applied on top of the second electrically conductive layer. A geometric shape is laser-cut from the multilayer structure, such that the geometric shape extends from the top to the bottom of the multilayer structure. The geometric shape cut out of the first electrically conductive layer forms a first electrically conductive channel 51; the geometric shape cut out of the second electrically conductive layer forms a second electrically conductive channel 52. The first and the second electrically conductive channel can be used to connect different electronic components. With this method two electrically conductive channels are formed without any additional process step compared to the creation of one electrically conductive channel. The only requirement is that the power of the laser is high enough to cut through the multilayer structure. It is difficult to obtain multilayer conductive channels using photolithographic processes as different layers have to be etched. In the worst case, the photolithographic process should be applied on each of the electrically conductive layers, which is very time-consuming.

The angle of the laser beam, also the laser cut L in FIG. 5, with respect to the multilayer structure may be equal to or different from 90° as is shown in FIG. 5. Preferably, the angle of the laser beam differs from 90°. The angle can for example vary between about 30° and 60° or between about 40° and 50°.

Figure 5D:
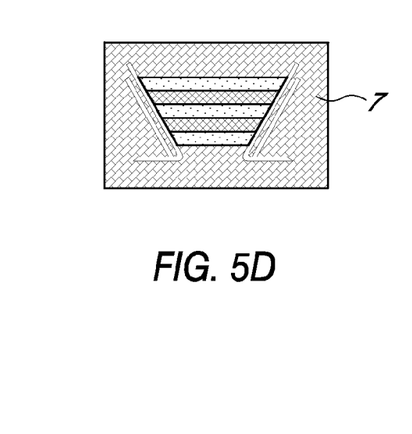

This kind of laser-cutting has the advantage that the resulting electrically conductive channels are easy to anchor in an embedding polymer, as is shown in FIG. 5D.

Also in case of multilayers, the method can additionally comprise a number of supplementary process steps which optimize the method. Before laser cutting, the multilayer structure may for instance be attached to a supporting layer. After laser cutting, the residual part of the multilayer structure can be removed, additional layers of polymers can be applied to embed the stretchable electronic device.

The creation of micro-channels 9 out of electrically conductive channels 5 can also be applied in the multilayer structure in order to further increase the number of created electrically conductive channels per square area.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A method of manufacturing a stretchable electronic device comprising at least one electrically conductive channel connecting at least two electrical components, the channel having a predetermined geometric shape by which the channel is stretchable, the method comprising:
   providing a flexible substrate comprising an insulating material and at least one layer of electrically conductive material on or embedded in the insulating material; and
   cutting a predetermined geometric shape from the flexible substrate with laser, wherein the laser cutting cuts through the insulating material and the at least one layer of electrically conductive material together, thereby creating at least one stretchable conductive channel.

2. The method according to claim 1, wherein the method further comprises dividing at least one of the electrically conductive channels into two or more micro-channels.

3. The method according to claim 2, wherein the dividing of at least one of the electrically conductive channels is performed by laser-cutting through the geometric shape.

4. The method according to claim 1, wherein the method further comprises attaching the flexible substrate to a supporting layer before being laser patterned.

5. The method according to claim 4, wherein the supporting layer is laser cut together with the flexible substrate.

6. The method according to claim 4, wherein the method further comprises removing the supporting layer after laser-cutting the geometric shape from the flexible substrate.

7. The method according to claim 1, wherein the method further comprises removing any unused cut part of the at least one flexible substrate and the electrically conductive layer after being laser patterned.

8. The method according to claim 1, wherein the method further comprises embedding the stretchable electronic device in a polymer.

9. The method according to claim 5, wherein the method further comprises applying a first polymer layer on the stretchable electronic device at a side opposite of the supporting layer after being laser patterned.

10. The method according to claim 5, wherein the method further comprises applying a second polymer layer on the stretchable electronic device at the side of the supporting layer after being laser patterned and after removing the support layer.

11. The method according to claim 9, further comprising creating extra holes in the flexible substrate to improve the adhesion of the first and/or second polymer layers on the flexible substrate.

12. The method according to claim 11 wherein the size of the extra holes varies between about 100 μm and 500 μm.

13. The method according to claim 1, wherein the geometric shape is meander shaped.

14. The method according to claim 13, wherein the meanders have a horseshoe shape, the horseshoe channel having the shape of a circular segment and an angle with respect to a 0°-baseline, a width and a diameter.

15. The method according to claim 14, wherein the angle is between about −20° and 45°.

16. The method according to claim 9 wherein laser cutting is performed under an angle different from 90° with respect to the flexible substrate such that the geometric structures are anchored in the first polymer layer.

17. The method according to claim 9, wherein laser cutting is performed under an angle between about 30° and 60° with respect to the flexible substrate.

18. The method according to claim 1, wherein the flexible substrate comprises at least two electrically conductive layers, each of the electrically conductive layers alternating with electrically insulating layers.

19. The method according to claim 1, wherein the electrically conducting layer is patterned in the form of a macro-channel.

20. A stretchable electronic device as manufactured by the method according to claim 1.

21. The method according to claim 1, wherein the geometric shape is meander shaped in a plane parallel to a top surface of the substrate.

22. The method according to claim 1, wherein both the insulating material and the electrically conductive material are flexible.

* * * * *